United States Patent [19]
Yastrow

[11] Patent Number: 5,938,755
[45] Date of Patent: Aug. 17, 1999

[54] METHOD AND APPARATUS FOR ESTIMATING POWER IN ELECTRONIC INTEGRATED CIRCUITS

[75] Inventor: Philip G. Yastrow, Fort Collins, Colo.

[73] Assignee: Hewlett-Packard Co., Palo Alto, Calif.

[21] Appl. No.: 08/176,297

[22] Filed: Jan. 3, 1994

Related U.S. Application Data

[63] Continuation of application No. 07/756,396, Sep. 6, 1991, abandoned.

[51] Int. Cl.[6] .................................................. G06F 1/26
[52] U.S. Cl. ................................. 710/300; 364/489
[58] Field of Search ......................... 395/750, 750.01; 364/488–491, 483, 707

[56] References Cited

U.S. PATENT DOCUMENTS

| | | | |
|---|---|---|---|
| 4,486,670 | 12/1984 | Chan et al. | 307/264 |
| 4,575,821 | 3/1986 | Eden et al. | 365/154 |
| 5,006,782 | 4/1991 | Pelly | 323/225 |
| 5,114,912 | 5/1992 | Benz | 505/1 |
| 5,119,314 | 6/1992 | Hotta et al. | 364/491 |
| 5,164,811 | 11/1992 | Tamura | 257/206 |

*Primary Examiner*—Gopal C. Ray

[57] ABSTRACT

A method for estimating power dissipation characteristics of a circuit includes the steps of analyzing predefined artwork data associated with the circuit to determine data on the geometry of a first node; generating capacitance data $C_n$ for the first node on the basis of the geometry data; generating frequency data $F_n$ associated with the first node on the basis of precomputed simulation data; determining voltage data $V_n$ associated with the first node; computing an estimate of power $P_n$ associated with the first node on the basis of the capacitance, frequency and voltage data; repeating the above steps for each remaining node; summing the estimates of power for each node to determine an estimate of total power dissipation $P_{circuit}$ for the circuit; and generating a report on the computed data.

17 Claims, 1 Drawing Sheet

METHOD AND APPARATUS FOR ESTIMATING POWER IN ELECTRONIC INTEGRATED CIRCUITS

CROSS REFERENCE TO RELATED APPLICATION(s)

This is a continuation of application Ser. No. 07/756,396 filed on Sep. 6, 1991, now abandoned.

FIELD OF THE INVENTION

The present invention is generally related to the field of electronic integrated circuits (ICs), and more particularly related to a method and apparatus for ascertaining power dissipation in an IC.

BACKGROUND OF THE INVENTION

Most electronic systems are built on the integrated circuit, which is an ensemble of active (e.g., transistors) and passive devices (e.g., resistors and capacitors) formed on and within a single-crystal semiconductor substrate and interconnected by a metallization pattern. The power required merely to charge and discharge circuit nodes, or nets, in an IC is proportional to the number of gates (transistors) and the frequency at which they are switched (clock frequency). The power of any node may be expressed as:

$$P \cong C_{node} \times V^2 \times F,$$

where $C_{node}$ is the capacitance of the node, V is the applied voltage and F is the clock frequency. The power in the chip is the summation of the power in all of the nodes. The temperature rise caused by this power dissipation in an IC package is limited by the thermal conductivity of the package material, unless auxiliary cooling is used. The maximum allowable temperature rise is limited by the bandgap of the semiconductor (approximately 100° C. for Si with a bandgap of 1.1 eV). For such a temperature rise, the maximum power dissipation of a typical high-performance package is about 10 W. As a result, the maximum clock rate or the number of gates on a chip must be limited. Thus, the process of designing an IC includes estimating the power required by the IC to perform its intended function at a specified speed, or frequency. Moreover, the difficulty and cost of deriving such an estimation has dramatically increased as the average number of devices per chip has grown over the past few years.

Accordingly, a primary goal of the present invention is to provide an efficient, automatic and reliable tool for ascertaining the expected power dissipation in an IC. A further goal of the present invention is to provide a tool that employs existing circuit analysis software, thus making it an inexpensive tool especially useful in the IC design process. These goals are achieved by the present invention, a specific embodiment of which is described in this specification.

SUMMARY OF THE INVENTION

The present invention encompasses methods for estimating power dissipation in an integrated circuit device. A first embodiment of the invention comprises the steps of analyzing at least predefined artwork data associated with the circuit to determine capacitance data associated with a node of the circuit; analyzing precomputed simulation data to determine frequency data associated with the node; determining voltage data associated with the node; computing an estimate of power associated with the node on the basis of at least the capacitance, frequency and voltage data; and generating an electronic signal indicative of the estimate of power.

In one embodiment of the invention the first step comprises performing a graphical analysis of the artwork data (the phrase graphical analysis as used herein encompasses an analysis of data defining the geometry of the respective nodes).

The step of computing the circuit's power dissipation $P_{circuit}$ may be carried out in accordance with the following formula:

$$P_{circuit} = \sum_{n=1}^{n=N} C_n \times V^2_n \times F_n.$$

In the above formula, n is an index, N represents the number of nodes, $C_n$ represents the capacitance of the node of index n, $V_n$ represents the voltage associated with the node of index n, and $F_n$ represents the frequency associated with the node of index n.

The frequency $F_n$ may be determined in accordance with the equation:

$$F_n = \text{toggles}_n/2,$$

wherein $\text{toggles}_n$ represents the number of times the voltage associated with the n-th node changes from positive to negative or from negative to positive in a specified interval of time. The value of $\text{toggles}_n$ may be determined in accordance with the present invention by a transistor level simulation program.

The present invention also encompasses methods that include the steps of analyzing predefined artwork data associated with the circuit to determine data on the geometry of a first node; generating capacitance data for the first node on the basis of the geometry data; generating frequency data associated with the first node; determining voltage data associated with the first node; computing an estimate of power associated with the first node on the basis of at least the capacitance, frequency and voltage data; repeating the above steps for each remaining node; summing the estimates of power for each node to determine an estimate of total power dissipation for the circuit; and generating an electronic signal indicative of the estimate of total power.

The present invention further encompasses apparatus for estimating power dissipation in an electronic circuit. Apparatus in accordance with the invention comprise means for analyzing at least predefined artwork data associated with the circuit to determine capacitance data associated with a node of the circuit; means for analyzing precomputed simulation data to determine frequency data associated with the node; means for determining voltage data associated with the node; means for computing an estimate of power associated with the node on the basis of at least the capacitance, frequency and voltage data; and means for generating an electronic signal indicative of the estimate of power.

Other features and advantages of the present invention are described below in connection with the detailed description of a preferred embodiment.

DETAILED DESCRIPTION OF THE PREFERRED EMBODIMENT

Figure 1:
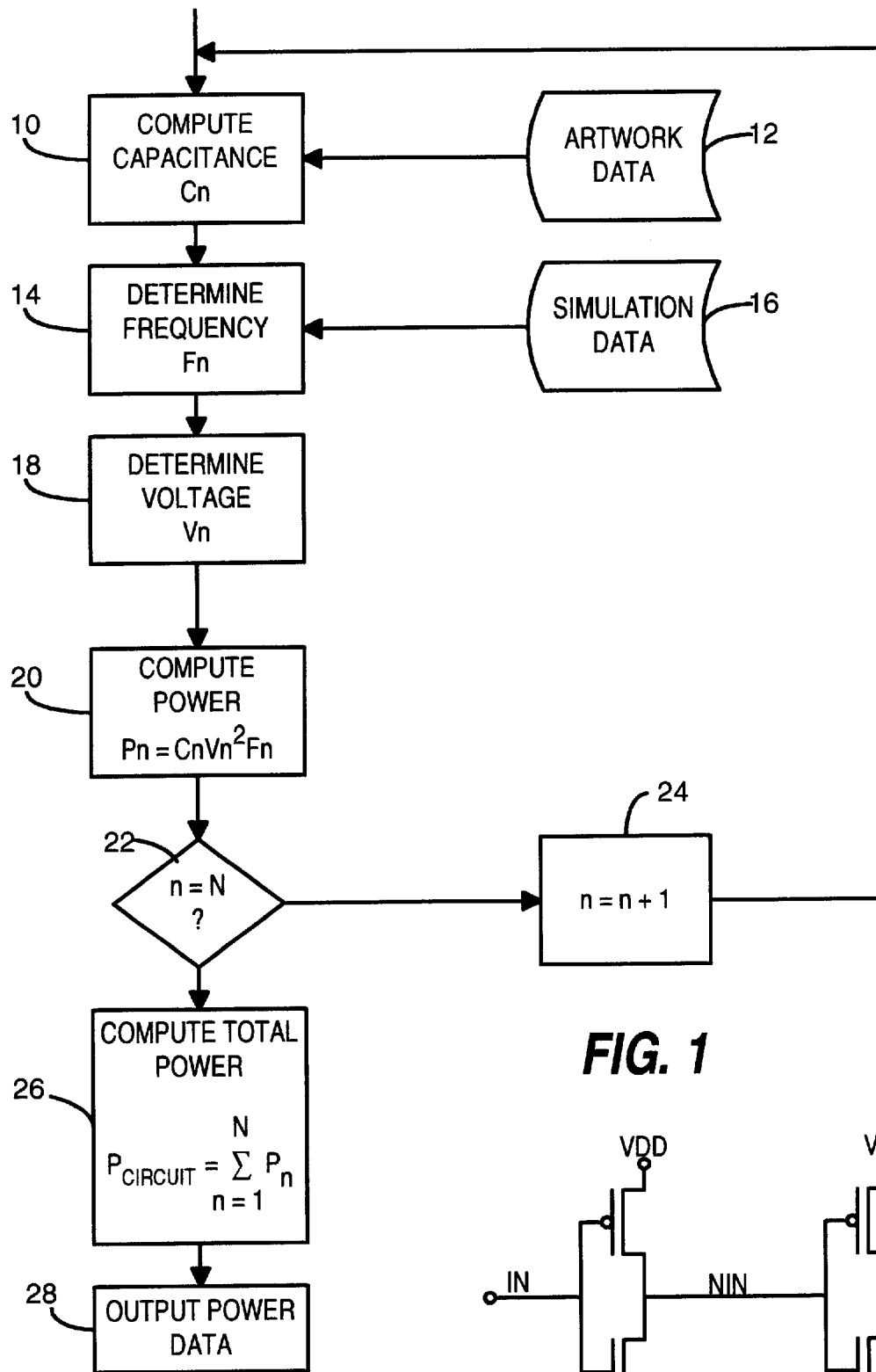
FIG. 1 is a flowchart of a power estimation computer program in accordance with the present invention.
Figure 2:
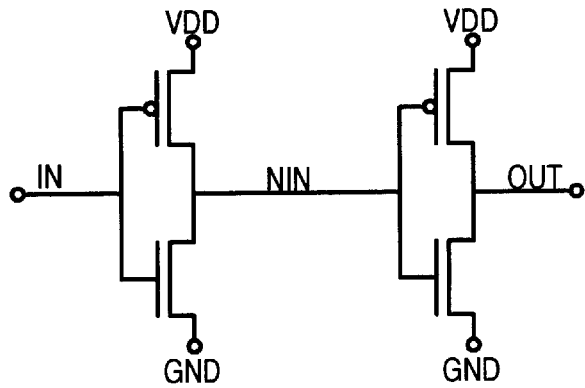
FIG. 2 is a schematic diagram of an exemplary IC device.

Referring to the flowchart of FIG. 1, a power estimation computer program in accordance with the present invention comprises a first block 10 that analyzes predefined artwork data 12 and on the basis of the artwork data computes capacitance data $C_n$ for the n-th node, where n is an index that is incremented from 1 to the number of nodes in the circuit N. Consider, e.g., the simple circuit of FIG. 2. Default capacitance values for each node, respectively labelled IN, NIN and OUT, are provided by the capacitance extraction program. In a specific embodiment of the present invention, this capacitance extraction process is carried out with a program called TRANTOR, which was developed by engineers of the Hewlett-Packard Company (HP), the assignee of this application. TRANTOR is a program that manipulates and analyzes graphical data, therefore it may be used to analyze IC artwork data to compute the capacitance at the respective nodes of an IC. It should be noted, however, that the specific TRANTOR program is not necessary to practice the present invention. What is necessary is a program that is capable of generating capacitance data for the nodes of the device to be checked. Such programs are well known, thus it unnecessary to describe one in detail in this application (e.g., two such programs are CHECKMATE, available from the Mentor corporation, and DRACULA, available from the CADENCE corporation). Therefore, as used in this specification, the term TRANTOR refers to a generic program for extracting capacitance data for a circuit from a description of the physical layout of the circuit.

A second block 14 analyzes precomputed simulation data 16 to determine the frequency $F_n$ associated with the node. The frequency $F_n$ is determined in accordance with the equation:

$$F_n = \text{toggles}_n / 2,$$

wherein toggles$_n$ represents the number of times the voltage associated with the n-th node changes from positive to negative or from negative to positive in a specified interval of time. In the specific embodiment referred to above, the simulation data (toggles$_n$) is generated by a switch-level logic simulator of the type discussed in copending, commonly assigned U.S. patent application Ser. No. 684,539, filed Apr. 11, 1991, which is hereby incorporated by reference into this specification. Since logic simulators are well known in the art and moreover since the present invention does not require any specific logic simulator to generate the toggle data from which the frequency is computed, a detailed description of a logic simulator will not be provided in this specification (one publicly available logic simulation program is VERILOG, available from the Cadence corporation).

A third block 18 determines the voltage $V_n$ associated with the node. The voltage will typically be the same for all nodes (e.g., 5 V) and will preferably be supplied by the user when invoking the program.

A fourth block 20 computes an estimate of power $P_n$ associated with the n-th node in accordance with the equation:

$$P_n = C_n \times V_n^2 \times F_n.$$

A decision block 22 determines whether n is equal to N, i.e., whether all nodes have been considered. If not, n is incremented by block 24 and the program loops to block 10; if so, the program proceeds to block 26.

Block 26 computes an estimate of total power $P_{circuit}$ required to charge and discharge the nodes of the circuit. $P_{circuit}$ is computed in accordance with the $$P_{circuit} = \sum_{n=1}^{n=N} P_n$$

Block 28 generates a report on the computed data for the user. The report may be printed and/or stored on disk (not shown).

A listing of source code for a computer program embodying the present invention is provided in an appendix preceding the claims. The source code is written in HPUX, a publicly available UNIX-like programming language.

It should be noted that many modifications of the specific embodiment described above will be within the true scope of the present invention as defined in the following claims. For example, the present invention is not limited to the use of a switch-level logic simulator in determining the frequency at which the respective nodes are to be charged and discharged. Nor is the invention limited to any specific program for extracting capacitance data from the circuit's artwork file.

APPENDIX

```
1   #       Makefile
2   # this is a makefile for the unix 'Make' utility
3   # it is used to compile the power program
4   #
5   #
6
7   CFLAGS =  -O  # default c-compile flag for optimization
8
9   OBJS = support.o yylex.o xxlex.o zzlex.o avl.o #  object files
10  SRCS = support.c lex.l xxlex.l zzlex.l # source files
11  RCSFILES = RCS/support.c,v RCS/lex.l,v RCS/xxlex.l,v RCS/zzlex.l,v
12
13  # final target is dependant on all obj files
14  power : $(OBJS)
15          cc $(CFLAGS) $(OBJS) -o power -ly -ll
16
17
18  # support.o (obj file) depends on support.c (source file). Let make
19  # use default build instructions (compile with CFLAGS)
20  support.o :    support.c
21
22  # y-parser instructions
23  yylex.c :               lex.l
24                  lex -t lex.l > yylex.c
25
26  # x-parser instructions. Note replacement of 'yy' with 'xx' for multiple
27  # parser usage
28  xxlex.o :       xxlex.c
29                  cc $(CFLAGS) -c xxlex.c
30
31  xxlex.c :       xxlex.l
32                  lex -t xxlex.l | sed -e 's/yy/xx/g' > xxlex.c
33
34  # z-parser instructions. Note replacement of 'yy' with 'zz' for multiple
35  # parser usage
36  zzlex.o :       zzlex.c
37                  cc $(CFLAGS) -c zzlex.c
38
39  zzlex.c :       zzlex.l
40                  lex -t zzlex.l | sed -e 's/yy/zz/g' > zzlex.c
41
42
43
```

```
1   /* support.c
2    *
3    * This is the support code for the parsers used in power.  It contains the main
4    * routine as well as all computation and non parser code
5    *
6    * This module invokes the following three parsers:
7    *    x-parser:  parse alias file for simulator which relates node name to
8    *               node number
9    *    y-parser:  parse the simulator output and gather toggle information based
10   *               on node number
11   *    z-parser:  parse capacitance data and store with toggle data
12   *
13   */
14
15  #include <stdio.h>
16  #include <ctype.h>
17  #define MAXNODES 200000       /* max node for circuit, increase if needed
18                                 * allocate statically for speed
19                                 */
20
21  extern FILE *yyout;           /* y-parser output file pointer */
22  extern FILE *yyin;            /* y-parser input file pointer */
23  extern FILE *xxin;            /* x-parser input file pointer */
24  extern FILE *xxout;           /* x-parser output file pointer */
25  extern FILE *zzin;            /* z-parser input file pointer */
26  extern FILE *zzout;           /* z-parser output file pointer */
27  extern char *yytext;          /* text being parsed */
28  char *getBlockLocation(),*strrchr(),*save(),*malloc(),*getenv();
29  double atof();
30  char
31    *program_name,              /* name of program for error reporting */
32    *dirName,                   /* string for determining block location */
33    ss[30],                     /* tmp string */
34    *testname="test1",          /* simulation test name. default = test1 */
35    manual=0,                   /* mode variable */
36    *capsum_file="capsum.max";  /* capacitance case. default = max */
37  extern int simtime;           /* simulation length */
38  int electromigration=0;       /* report format option */
39  double
40    voltage=5.5,                /* voltage swing */
41    increment=1,                /* nanoseconds per simulator tick */
42    power=0;                    /* total power variable */
43  char paths[30][256];          /* all elements in a blockpath */
44  char *getenv(),
45    *icprocess;                 /* cmos34 or cmos26 */
46  FILE *openUp(),*try;
47
48
49  char caseInsensitive=0;       /* case insensitivity flag */
50
51  struct {                      /* basic structure for a node */
52    char   *name;       /* its name */
53    double    C;              /* its capacitance*/
54    int    toggles;     /* number of toggles */
55    int    nodenum;     /* its node number in simulator */
56  } node[MAXNODES];             /* allocate all node structures now, for speed
57                                 */
58
59  main(argc,argv)
60      int     argc;
```

```
61      char    **argv;
62  {
63      char *s;
64      extern int optind;
65      extern char *optarg;
66      /* define the usage string */
67      static char usage[]= "usage: %s [-c capcase] [-e] [-m] [-t test] [-i increment(ns)] [-v volts] blockname\n\
68          -c capcase: use max,nom or min capacitance (default: max)\n\
69          -e: dump electromigration data for each node\n\
70          -m: manual mode to inspect individual nodes contribution to total power\n\
71          -t testname: the name of the awsim test (default is test1)\n\
72          -i increment: number of nanoseconds for each awsim step (default 10)\n\
73          -v voltage: the voltage swing for all nodes (default 5.5 volts)\n\n";
74      int c;
75      /*    /* remember the program name for error writing */
76          if((s=strrchr(argv[0],'/')) == NULL)
77              program_name=argv[0];
78          else
79              program_name=s+1;
80      /* parse user options */
81      while ((c=getopt(argc,argv,"c:f:i:emt:v:"))!=EOF) {
82          switch(c) {
83          case 't': /* test name */
84              testname=save(optarg);
85              break;
86          case 'i': /* nanoseconds per simulator tick */
87              increment = atof(optarg);
88              break;
89          case 'v': /* voltage swing */
90              voltage = atof(optarg);
91              break;
92          case 'm': /* manual mode */
93              manual=1;
94              break;
95          case 'e': /* electromigration mode */
96              electromigration = 1;
97              break;
98          case 'c': /* capacitance case */
99              capsum_file=malloc(20);
100             strcpy(capsum_file,"capsum.");
101             strcat(capsum_file,optarg);
102             break;
103         default: /* error print usage */
104             fprintf(stderr,usage,program_name);
105             exit(1);
106         }
107     }
108
109     /* redefine yyout and xxout to go to /dev/null */
110     yyout = fopen("/dev/null","w");
111     xxout = fopen("/dev/null","w");
112     zzout = fopen("/dev/null","w");
113
114     /* get ICPROCESS variable */
115
116     icprocess = save( getenv("ICPROCESS"));
117
118     while(1) {  /* repeat until broken */
119         if (argv[optind]) {
120             getBlockLocation(argv[optind]); /* find BLOCK */
```

```
121     }
122     else {  /* need block name */
123        fprintf(stderr,usage,program_name);
124        exit(1);
125     }
126     xxin = openUp(argv[optind],"/awsim/alias_file"); /* open alias file */
127     xxlex();              /* parse simulator alias file */
128     fclose(xxin);         /* close alias file */
129     s = malloc(256);      /* build testname listfile string */
130     strcpy(s,"/awsim/");
131     strcat(s,testname);
132     strcat(s,"/list");
133     yyin = openUp(argv[optind],s); /* open list file for toggle info */
134     yylex();    /* parse simulator list file */
135     fclose(yyin);         /* close file */
136     yytext = malloc(50);  /* build file name for capacitance data */
137     strcpy(yytext,"/cap_");
138     strcat(yytext,icprocess);
139     strcat(yytext,"/");
140     strcat(yytext,capsum_file);
141     zzin = openUp(argv[optind],yytext); /* open capacitance file */
142     zzlex();    /* parse capacitance file */
143     fclose(zzin);         /* close capacitance file */
144     summation(argv[optind]); /* sum time avgd power on all nodes */
145     if (manual) control();   /* go into manual mode, if chosen */
146     if (!argv[++optind])
147        break;     /* end loop */
148   }
149   exit(0);                /* exit program */
150 }
151
152 /* control user choices for manual mode query */
153 control()
154 {
155   int i=0;
156   register char *name;
157   while(1) {
158     fprintf(stderr,"node name --> ");
159     scanf("%s",ss);            /* get user's node choice */
160     if (!strcmp(ss,"q")) return(0); /* quit on 'q' */
161     while (node[i].name) {     /* grunt search for node name */
162        if (!strcmp(node[i].name,ss)) { /* found it, print out info */
163           printf("node: %s\n",node[i].name);
164           printf("alias: %d\n",i);
165           printf("C = %e\n",node[i].C);
166           printf("toggles = %d (%g nanoseconds)\n",
167                  node[i].toggles,simtime*increment);
168           printf("frequency = %g Hz\n",
169                  node[i].toggles/(simtime*increment*1e-9)/2);
170           printf("time averaged power = %g Watts\n",
171                  node[i].C * node[i].toggles *
172                  voltage * voltage / simtime / 1e-9 / increment / 2);
173           i=0;
174           break;
175        }
176        i++;
177     }
178     if (i) fprintf(stderr,"%s not found\n",ss); /* couldn't find node */
179     i=0;
180     printf("\n");
```

```
181     }
182   }
183
184
185   /* sum up the power on all nodes, if electromigration output is desired,
186    * print info for all nodes
187    */
188   summation(block)
189         char *block;
190   {
191     int j=(-1);                  /* start index at -1, yuk */
192     double thispower;            /* power for this node */
193     fprintf(stderr,"computing power ...\n");
194     if(electromigration)         /*  electromigration format headed*/
195       {
196         printf("\t\tCircuit Electromigration Data\n\n");
197         printf("Node\t\tCapicatance\tToggle\t\tBidirectional\n");
198         printf("Name\t\t(fF)\t\tFrequency (MHz)\tCurrent (mA)\n");
199         printf("=============================================================\n");
200       }
201
202     while(node[++j].name) {      /* do this for each node */
203       thispower = node[j].C * node[j].toggles * voltage * voltage /
204         simtime / 1e-9 / increment / 2;    /* the power is cv^2f, but f=2/toggles
205                                             * also, simtime is number of simulator
206                                             * ticks, so need to calc time in nano
207                                             * seconds
208                                             */
209       if(electromigration)       /* a special format of the same ol' data */
210         {
211            printf("%-15s\t%8.3g\t%8.3g\t%8.3g\n",node[j].name,
212                  node[j].C*1e15,
213                  (node[j].toggles/(2 * simtime * 1e-3 * increment)),
214                  thispower / voltage * 2000);
215         }
216       power += thispower;        /* add this node's power to total power */
217       if (node[j].C == 0)        /* print warning if no capacitance for node */
218         fprintf(stderr,
219                 "%s: WARNING: node \"%s\" has no capacitance\n",
220                 program_name,node[j].name);
221       if (node[j].toggles == 0)  /* print warning if no toggles for node */
222         fprintf(stderr,
223                 "%s: WARNING: node \"%s\" did not toggle\n",
224                 program_name,node[j].name);
225     }
226     if(electromigration)         /* electrmigration format trailer */
227       printf("=============================================================\n");
228
229     printf("time averaged power = %g Watts\n",power); /* print total power */
230   }
231
232   /* store string in a safe place */
233   char *save(s)
234         char *s;
235   {
236     char *p;
237     p = malloc(strlen(s)+1);
238     if (!p){
239       fprintf(stderr,"OUT OF MEMORY\n");
240       exit(1);
```

```
241    )
242    strcpy(p,s);
243    return (p);
244  )
245
246  /* this routine parses blockpath variable into distinct directories
247   * for later searching in openUp routine */
248  char *getBlockLocation(block)
249       char *block;
250  {
251    char *blockPath;
252    int i=0,j=0,k=0;
253    blockPath=save(getenv("BLOCKPATH"));
254    while (blockPath[i]) {
255       while (blockPath[i] != ':' && blockPath[i] != 0)
256          paths[k][j++] = blockPath[i++];
257       paths[k][j] = 0;
258       i++;
259       k++;
260       j=0;
261    }
262    strcpy(paths[k],"");
263  }
264
265
266  /* find where the block lives on disk, and open the file needed */
267  FILE *openUp(block,file)
268       char *block,*file;
269  {
270    int i=0;
271    char *string;
272    if (!dirName)              /* block has not yet been found */
273       while(paths[i][0]) {    /* for each possible directory */
274          string = malloc(256);
275          strcpy(string,paths[i]);  /* build file string */
276          strcat(string,"/");
277          strcat(string,block);
278          strcat(string,file);
279          try = fopen(string,"r"); /* try to open file */
280          if (try) {              /* this is it */
281             dirName=paths[i];    /* save directory name for later use */
282             fprintf(stderr,"parsing %s ...\n",string);
283             free(string);
284             return(try);         /* return file pointer */
285          }
286          free(string);           /* memory mizer */
287          i++;
288       }
289    else {                    /* block already found, so don't search all
290                               * directories
291                               */
292       string = malloc(256);
293       strcpy(string,dirName);  /* build file string */
294       strcat(string,"/");
295       strcat(string,block);
296       strcat(string,file);
297       try = fopen(string,"r"); /* try to open file */
298       if (try) {              /* got it */
299          fprintf(stderr,"parsing %s ...\n",string);
300          free(string);
```

```
301      return(try);                    /* return file pointer */
302    }
303    free(string);
304  }
305  /* could not find file. Abort entire program */
306  fprintf(stderr,"%s: unable to open file \"%s/%s%s\"\n",program_name,dirName,block,file);
307  exit(1);
308 }
```

```
1   %{
2   /*                    lex.l
3    * This is a file in 'lex' (a common unix utility) format.  It will generate
4    * a parser to parse the simulation list file.  Simtime data is in the format:
5    *
6    *       (* Time: simtime
7    *
8    * for each simulator tick.  The last one of these is then the total number
9    * of ticks.
10   *
11   * Toggle data is in the format:
12   *
13   *       ACTIVITY ARRAY
14   *       nodenum  lowtoggles hightoggles    (repeated for each node)
15   *       ENDACTIVITY ARRAY
16   */
17
18
19
20  #include <stdio.h>
21  #include <ctype.h>
22
23  extern FILE *xxin;         /* x-parser's input file pointer */
24  char c;
25
26  int simtime;               /* number of sim ticks */
27  extern int i_node;
28
29  extern struct {            /* extern node structure */
30          char    *name;
31          double  C;
32          int     toggles;
33          int     nodenum;
34  } node[];
35
36
37  %}
38  /* define macros for whitespace and numbers */
39  W       [ \t]
40  number  [0-9]+
41  /* define states for parser */
42  %s time node_num toggle activity endactivity
43
44  %%
45
46
47  "(* Time: "  {   /* sim time definition, last one of these found
48                   * will be the total sim time */
49                  BEGIN( time ); /* look for time */
50          }
51
52  <time>{number}  {               /* found time */
53                  simtime=atoi(yytext); /* convert to integer */
54                  BEGIN( 0 );
55          }
56
57
58  <activity>"ACTIVITY ARRAY".*    { /* end of activity array */
59                  BEGIN( endactivity );
60          }
```

```
61
62   "ACTIVITY ARRAY".*     { /* beginning of activity array */
63                            BEGIN( activity );
64                          }
65
66
67
68   <activity>(number)     { /* toggle info for this node */
69                            i_node=atoi(yytext); /* save node number */
70                            BEGIN( node_num ); /* look for toggle info */
71                          }
72
73   <node_num>(number)     { /* first number of low toggles */
74                            node[i_node].toggles=atoi(yytext);/* save low toggles */
75                            BEGIN( toggle ); /* look for high toggles */
76                          }
77
78   <toggle>(number)       { /* found high toggles */
79                            /*add to low toggles*/
80                            node[i_node].toggles+=atoi(yytext);
81                            BEGIN( activity ); /* look for next node */
82                          }
83   %%
84
85       /* do nothing upon file end */
86   yywrap()
87   {
88   }
```

```
1   %{
2   /*              xxlex.l
3    * This is a file in 'lex' (a common unix utility) format.  It will generate
4    * a parser to parse the simulation alias file.  Data is in the format
5    *          A nodenumber nodename
6    * for each node.
7    * The makefile used to create
8    * this parser will replace all occurrences of 'yy' with 'xx' so I can use
9    * multiple lex parsers in this program
10   */
11
12  #include <stdio.h>
13  #include <ctype.h>
14  #include "avl.h"
15
16  extern FILE *yyin;          /* y-parser's input file pointer */
17  char c,*save();
18  extern char caseInsensitive;
19
20  int simtime;                /* total number of simulator ticks */
21  int i_node,maxnode=0,n;
22  avlnode *root=NULL;
23
24  extern struct item {        /* external node structure */
25          char    *name;
26          double  C;
27          int     toggles;
28          int     nodenum;
29  } node[];
30
31
32  %}
33  /* define macros for whitespace, names and numbers */
34  W       [ \t]
35  name    [_A-Za-z0-9/]("["|"]"|[\.A-Za-z0-9_/-])*
36  number  [0-9]+
37
38  /* define states for parser */
39
40  %s NUM NAME
41
42  %%
43
44  ^A[^ \t]*   {           /* alias definition started,
45                           * look for number
46                           */
47      BEGIN( NUM );
48  }
49
50  <NUM>{number}   {                   /* number found */
51      i_node = atoi(yytext); /* convert number to integer */
52      node[i_node].nodenum = i_node; /* save in structure */
53      if (i_node > maxnode) maxnode = i_node;     /* save max node number*/
54      BEGIN( NAME );
55  }
56
57  <NAME>{name}    {                   /* name found */
58      if (caseInsensitive) for(n=0 ; yytext[n] != NULL ; n++)
59          yytext[n] = toupper(yytext[n]); /* convert to all upper case, if user
60                                           * wants case insensitivity */
```

```
61    node[i_node].name = save(yytext),  /* save name in structure */
62    BEGIN( 0 );
63  }
64
65  %%
66  /* lexiographic name comparison */
67  int ncompare(ptr1,ptr2)
68  struct item *ptr1,*ptr2;
69  {
70         return(strcmp(ptr1->name,ptr2->name));
71  }
72
73  /* after all nodes are parsed, place all of their names in an avl tree */
74  yywrap()
75  {
76         for (i_node=0 ; i_node <= maxnode ; i_node++)
77                 avl_insert(&node[i_node], &root, ncompare);
78  }
79
80
81
82
83
84
```

```
1   %{
2   /*              zzlex.l
3    * This is a file in 'lex' (a common unix utility) format.  It will generate
4    * a parser to parse the capacitance data file.  Data is in the format:
5    *           nodename    capacitance_value
6    * for each node.
7    *
8    * The makefile used to create
9    * this parser will replace all occurrences of 'yy' with 'zz' so I can use
10   * multiple lex parsers in this program
11   *
12   */
13
14  #include <stdio.h>
15  #include <ctype.h>
16  #include "avl.h"
17
18  extern avlnode *root;         /* root of avl tree */
19  extern FILE *yyin;
20  char c,*save(),*name;
21  double atof(),C;
22  extern char caseInsensitive,*program_name;
23
24  int i,n;
25  char *thisNode;
26  int nretrieve();
27
28  extern struct item {          /* external node structure */
29          char    *name;
30          double  C;
31          int     toggles;
32          int     nodenum;
33  } node[];
34
35  struct item *whatnode;        /* pointer for finding a given node */
36
37  %}
38  /* define macros for whitespace, names and numbers */
39  W       [ \t]
40  name    [_A-Za-z/]("["|"]"|[\.A-Za-z0-9_/-])*
41  number  [0-9]+
42
43  %%
44
45
46  {name}  { /* look for a name */
47      name = save(yytext);      /* save name */
48  }
49
50
51  [0-9][\.0-9e-]*$ { /* look for a capacitance value, make sure value
52                     * is the last column */
53      /* find the node in the avl tree */
54      whatnode = (struct item *)avl_search(name,root,nretrieve);
55      if (!whatnode)            /* couldn't find the node, print warning */
56        fprintf(stderr,"%s: WARNING: node \"%s\" not in alias file (no power component included)\n",program_name,
57          name);
58      C = atof(yytext);         /* convert cap value to floating point */
59      if (C > 0.1)              /* chances are, this is a femto farad cap */
60        C *= 1e-15;             /* so scale appropriately */
```

```
61      if (whatnode != NULL)       /* found the node, so store the capacitance */
62          whatnode->C = C;
63      }
64  %%
65  /* lexiographic comparison for node name searches */
66  int nretrieve(string,ptr)
67  char *string;
68  struct item *ptr;
69  {
70          return(strcmp(string,ptr->name));
71  }
72  /* upon completing file parsing do nothing but return */
73  yywrap()
74  {
75  }
```

What is claimed is:

1. A computer implemented method for estimating power dissipation characteristics of a circuit comprising a plurality of nodes, the method used in a circuit design process for designing an electronic circuit for operation at a certain clock rate and having a first number of nodes and a second number of gates, said method comprising the following steps:

(a) analyzing predefined artwork data associated with said circuit to determine data on the geometry of a first node;

(b) generating capacitance data for said first node on the basis of said geometry data;

(c) generating frequency data associated with said first node;

(d) determining voltage data associated with said first node;

(e) computing an estimate of power associated with said first node on the basis of at least said capacitance, frequency and voltage data;

(f) repeating the above steps for each remaining node;

(g) summing said estimates of power for each node to determine an estimate of total power dissipation for the circuit; and (h) generating output data indicative of said estimate of total power;

said output data being used in said circuit design process to determine whether at least one of (1) the number of gates of said circuit should be altered and (2) said clock frequency should be altered.

2. The method recited in claim 1, wherein said estimate of total power ($P_{circuit}$) is computed in accordance with the following formula:

$$P_{circuit} = \sum_{n=1}^{n=N} C_n \times V^2_n \times F_n,$$

where n is an index, N represents the number of nodes, $C_n$ represents the capacitance of the node of index n, $V_n$ represents the voltage associated with the node of index n, and $F_n$ represents the frequency associated with the node of index n.

3. The method recited in claim 2, wherein said frequency $F_n$ is generated by running a predefined transistor level simulation program to generate data representing the number of times (toggles$_n$) the voltage associated with the n-th node changes from positive to negative or from negative to positive in a specified interval of time, and then computing $F_n$ in accordance with the equation: $F_n$=toggles$_n$/2.

4. In a process for designing a physical layout of an integrated circuit (IC) comprising a plurality of gates, said physical layout of said IC having at least one node and being evaluated to determine whether power dissipation from said IC is expected to exceed a maximum power dissipation requirement for said IC, a method for estimating said power dissipation comprising the steps of:

(a) analyzing predefined artwork data indicative of said physical layout of said integrated circuit to determine capacitance data associated with at least one node of said IC;

(b) analyzing precomputed simulation data to determine frequency data associated with said at least one node;

(c) determining voltage data associated with said at least one node; and (d) estimating the power dissipated from said at least one node on the basis of at least said capacitance, frequency, and voltage data;

said power dissipation so estimated being utilized in said process for designing said IC.

5. A method as recited in claim 4, wherein said steps of determining capacitance data, frequency data, and voltage data, are carried out by means of first, second, and third computer programs, respectively.

6. A method as recited in claim 5, further comprising the step of determining whether at least one of (1) the number of gates of said IC should be altered and (2) whether a clock frequency of said IC should be altered.

7. A method as recited in claim 6, wherein said estimate of total power ($P_{circuit}$) is computed in accordance with the following formula:

$$P_{circuit} = \sum_{n=1}^{n=N} C_n \times V^2_n \times F_n,$$

where n is an index, N represents the number of nodes, $C_n$ represents the capacitance of the node of index n, $V_n$ represents the voltage associated with the node of index n, and $F_n$ represents the frequency associated with the node of index n.

8. A method as recited in claim 7, wherein said frequency $F_n$ is generated by running a predefined transistor level simulation program to generate data representing the number of times (toggles$_n$) the voltage associated with the n-th node changes from positive to negative or from negative to positive in a specified interval of time, and then computing $F_n$ in accordance with the equation: $F_n$=toggles$_n$/2.

9. A method as recited in claim 4, further comprising the step of determining whether at least one of (1) the number of gates of said IC should be altered and (2) whether a clock frequency of said IC should be altered.

10. A computer-implemented process for designing an integrated circuit (IC) having a maximum power dissipation below a required level, said IC having a predetermined clock frequency, a first number of nodes and a second number of gates, comprising the steps of:

(a) analyzing predefined artwork data indicative of a physical layout of said integrated circuit to determine capacitance data associated with a node of said IC;

(b) analyzing precomputed simulation data to determine frequency data associated with said node;

(c) determining voltage data associated with said node;

(d) estimating the power dissipated from said node based on at least said capacitance, frequency and voltage data;

(e) repeating steps (a) through (d) for each node of said IC:

(f) accumulating said estimates of the power dissipated from each of said nodes of said IC to provide an estimate of the total power dissipated from said IC; and (g) comparing said estimate of said total power dissipated from said IC to said maximum power dissipation.

11. A process as recited in claim 10, wherein said steps of determining capacitance data, frequency data, and voltage data, are carried out by means of first, second, and third computer programs, respectively.

12. A process as recited in claim 11, further comprising the step of determining whether at least one of (1) the number of gates of said circuit should be altered and (2) whether said clock frequency should be altered.

13. A process as recited in claim 12, wherein said estimate of total power ($P_{circuit}$) is computed in accordance with the following formula:

$$P_{circuit} = \sum_{n=1}^{n=N} C_n \times V^2{}_n \times F_n,$$

where n is an index, N represents the number of nodes, $C_n$ represents the capacitance of the node of index n, $V_n$ represents the voltage associated with the node of index n, and $F_n$ represents the frequency associated with the node of index n.

14. A method as recited in claim 13, wherein said frequency $F_n$ is generated by running a predefined transistor level simulation program to generate data representing the number of times ($toggles_n$) the voltage associated with the n-th node changes from positive to negative or from negative to positive in a specified interval of time, and then computing $F_n$ in accordance with the equation: $F_n = toggles_n / 2$.

15. A process as recited in claim 10, further comprising the step of determining whether at least one of (1) the number of gates of said circuit should be altered and (2) whether said clock frequency should be altered.

16. A system for designing an integrated circuit (IC) having a maximum power dissipation below a required level, said IC having a predetermined clock frequency, a first number of nodes and a second number of gates, comprising:

(a) first means for analyzing predefined artwork data indicative of a physical layout of said integrated circuit to determine capacitance data associated with a node of said IC;

(b) second means for analyzing precomputed simulation data to determine frequency data associated said node;

(c) third means for determining voltage data associated with said node;

(d) fourth means for estimating the power dissipated from said node based on at least said capacitance, frequency and voltage data;

(e) fifth means for accumulating estimates of the power dissipated from each of said nodes of said IC to provide an estimate of the total power dissipated from said IC; and (f) sixth means for comparing said estimate of said total power dissipated from said IC to said maximum power dissipation.

17. A system as recited in claim 16, wherein said first, second, and third means comprise first, second, and third computer programs, respectively.

* * * * *